(12) United States Patent
Ang

(10) Patent No.: US 7,949,916 B1
(45) Date of Patent: May 24, 2011

(54) SCAN CHAIN CIRCUITRY FOR DELAY FAULT TESTING OF LOGIC CIRCUITS

(75) Inventor: Chin Hai Ang, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 171 days.

(21) Appl. No.: 12/356,495

(22) Filed: Jan. 20, 2009

(51) Int. Cl.
*G01R 31/28* (2006.01)
(52) U.S. Cl. ...................................................... 714/726
(58) Field of Classification Search .................. 714/726, 714/727
See application file for complete search history.

(56) References Cited

U.S. PATENT DOCUMENTS

| 7,266,742 | B1 | 9/2007 | Pandey |
| 2008/0010572 | A1 | 1/2008 | Sul |
| 2008/0010573 | A1 | 1/2008 | Sul |

OTHER PUBLICATIONS

Savir, Jacob. "Scan-Based Transition Test." IEEE Transactions on Computer-Aided Design of Integrated Circuits and Systems, vol. 12, No. 8, p. 1232-1241, Aug. 1993.

*Primary Examiner* — James C Kerveros
(74) *Attorney, Agent, or Firm* — Treyz Law Group; G. Victor Treyz; Jason Tsai

(57) ABSTRACT

Scan chain circuitry is provided for performing scan chain testing of integrated circuits. The integrated circuits being tested may include programmable logic. The scan chain circuitry may include scan chain cells. Each scan chain cell may have a first logic circuit that receives a scan enable signal. When the scan enable signal is asserted, the scan chain cells may be connected to form a scan chain for test data loading and unloading. Each scan chain cell may also include a second logic circuit. The second logic circuit in each scan chain cell may receive a test enable signal. Signal transitions may be created at the output of scan chain cells by loading the scan chain cells with data, deasserting the scan enable signal while the test enable signal is asserted, and applying a clock. At speed delay fault tests may be performed using the scan chain circuitry.

16 Claims, 19 Drawing Sheets

SCAN CHAIN CIRCUITRY FOR DELAY FAULT TESTING OF LOGIC CIRCUITS

BACKGROUND OF THE INVENTION

This invention relates to testing integrated circuits, and more particularly, to at-speed logic testing using scan chain circuitry.

Integrated circuits typically contain numerous circuit components such as metal-oxide-semiconductor transistors. These components may be used to form a variety of combinational and sequential logic circuits. A modern integrated circuit may contain thousands or millions of circuit components.

Particularly in integrated circuits such as these, testing is challenging. The number of input-output pins on an integrated circuit is limited. This can make it difficult to determine whether circuitry that is located within the interior of the integrated circuit is functioning properly.

To facilitate testing of integrated circuits, many integrated circuits are provided with scan chain circuitry. Scan chain circuitry may be selectively formed from chains of linked registers. These chains may be provided throughout an integrated circuit. During normal operation, the scan chain circuitry can be disabled. During testing, the scan chains can be used to load test data and to unload captured test results.

For example, when it is desired to apply a particular set of test inputs to circuitry within an integrated circuit under test, test data can be loaded into the integrated circuit through a scan chain. After the test data has been loaded, one or more clock cycles may be applied to the circuitry to test the operation of the circuitry. The results of this type of test may be captured and unloaded from the integrated circuit using scan chain circuitry. Analysis of the captured test results may help reveal whether the circuitry is responding properly to the input data. For example, the presence of a fault may be revealed if a logic one was captured when a logic zero was expected.

Circuit faults that are sensitive to timing are not always detected when performing conventional scan tests. Accordingly, so-called transition delay fault (TDF) testing is performed at speed. If, for example, an integrated circuit is designed to operate with a clock speed of 400 MHz, TDF testing may be performed that subjects circuitry under test to a 400 MHz clock.

To ensure satisfactory test coverage, TDF testing may be performed using scan chains. Conventional scan chain TDF testing involves the use of launch-off-capture (LOC) and launch-off-shift (LOS) methodologies.

Conventional launch-off-capture techniques rely partly on the operation of user logic. User logic that is normally used in implementing logic functions for an end user of the integrated circuit being tested is used in generating a launch pulse. The launch pulse is then used in performing an at-speed test. Although this technique may often be satisfactory, it may be difficult or impossible to produce the desired launch pulse from user logic in some integrated circuits, leading to incomplete test coverage.

Conventional launch-off-shift techniques can often provide better test coverage than launch-off-capture techniques. With launch-off-shift arrangements, a high speed scan enable signal is applied to appropriate registers in a scan chain. The high speed scan enable signal facilitates generation of the launch pulse and avoids reliance on user logic in generating the launch pulse. While this type of approach may often be satisfactory, precise control of the scan enable and clock signals is required. Adequately addressing these timing issues can require the use of costly high speed test equipment or complex on-chip test circuitry.

Programmable logic device integrated circuits are a type of integrated circuit in which a user can configure logic to perform a desired custom logic function. Programmable logic circuits often contain logic elements that include scan cells for forming scan chains.

It would be desirable to be able to provide improved scan chain circuitry for performing at speed scan chain logic tests for integrated circuits such as such as programmable logic device integrated circuits.

SUMMARY OF THE INVENTION

In accordance with the present invention, scan chain circuitry is provided for performing scan chain testing of integrated circuits. The integrated circuits being tested may include programmable logic. For example, the integrated circuits may contain user logic formed from programmable logic having programmable elements loaded with configuration data or may contain user logic that has been formed by mask programming.

The scan chain circuitry may include scan chain cells. Each scan chain cell may have a first logic circuit that receives a scan enable signal. The first logic circuit may be based on a multiplexer. When the scan enable signal is asserted, the scan chain cells may be connected by the first logic circuit in each cell to form a scan chain for test data loading and test data unloading.

Each scan chain cell may also include a second logic circuit. The second logic circuit in each scan chain cell may receive a test enable signal. Signal transitions may be created at the output of the scan chain cells by loading the scan chain cells with data and deasserting the scan enable signal while the test enable signal is asserted. The second logic circuit may include circuitry that is responsive to a register output signal, the test enable signal, and user logic output from a block of user logic. The register output signal that is used in a given scan cell may be generated by a register in a previous scan cell or may be obtained by feeding back the output of the register in the given scan cell to the input of the register in the given scan cell using a feedback path. The feedback path may be selectively formed in response to the test enable signal. Logic gates such as AND gates, exclusive OR gates, and other circuitry may be used in the second logic circuit to selectively form the feedback path.

The scan chain circuitry may be used to perform at speed delay fault testing. Scan chain cells may be implemented using the resources available in logic elements or other regions of logic on integrated circuits such as programmable logic devices based on programmable memory elements and mask-programmed programmable logic elements.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to scan testing of integrated circuits. The integrated circuits that are tested may be digital signal processors, microprocessors, memory chips, circuits containing analog and digital circuitry, audio circuits, video circuits, wireless circuits, communications circuits, application specific integrated circuits (ASICs), etc. These circuits may include registers or other elements that allow some of the circuitry to be customized (as an example). With one suitable arrangement, which is sometimes described herein as an example, the integrated circuits that are tested are programmable integrated circuits such as programmable logic device integrated circuits. This example is, however, merely illustrative. In general, any suitable circuitry may be scan chain tested if desired.

Figure 1:
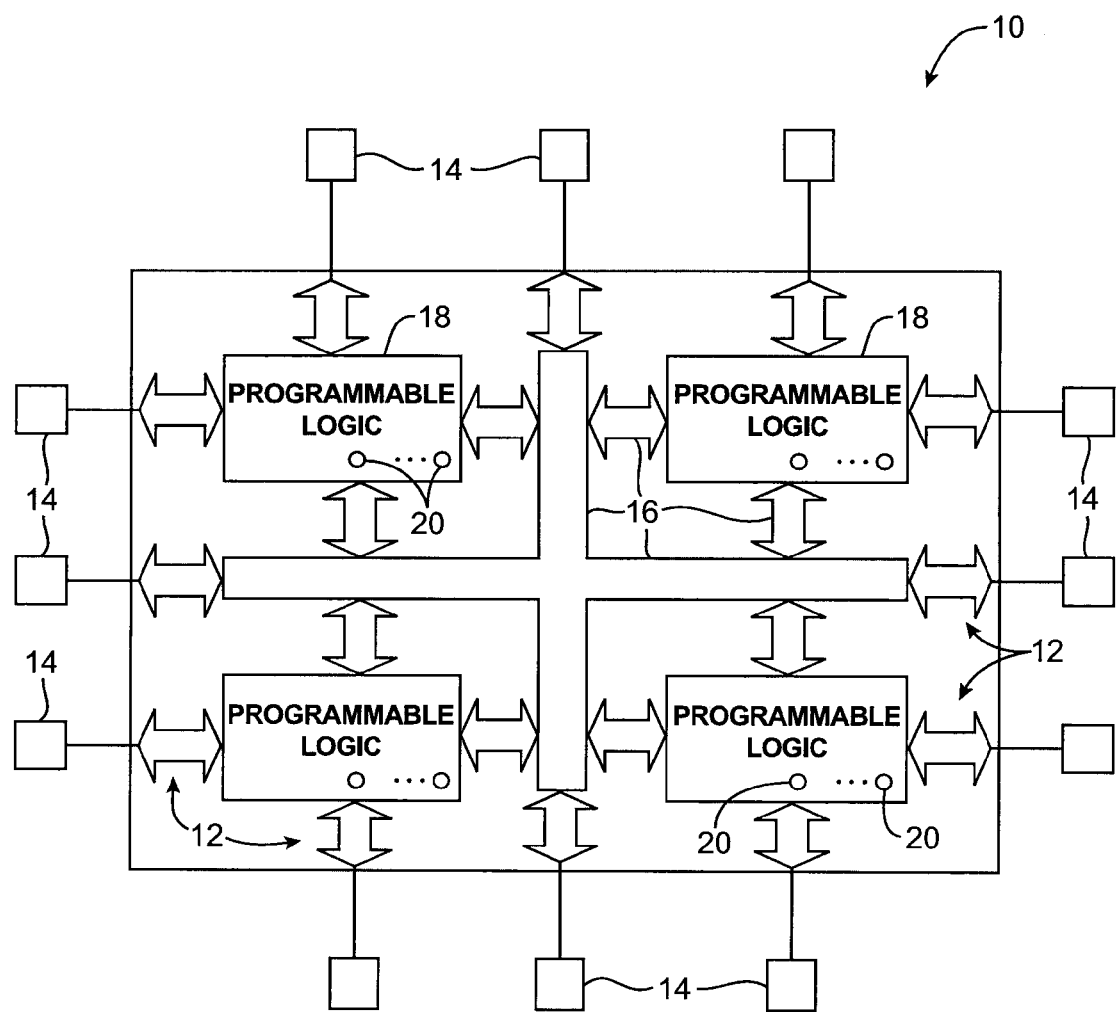
FIG. 1 is a schematic diagram of an illustrative programmable logic device integrated circuit in accordance with an embodiment of the present invention.

An illustrative integrated circuit such as a programmable logic device integrated circuit 10 is shown in FIG. 1.

Device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Programmable logic 18 may include combinational and sequential logic circuitry. The programmable logic 18 may be configured to perform a custom logic function.

Programmable logic device 10 may be based on any suitable programmable technology. With one suitable approach, configuration data (also called programming data) may be loaded into programmable elements 20 using pins 14 and input/output circuitry 12. The programmable elements (also sometimes called configuration bits or programmable function control elements) may each provide a static control output signal that controls the state of an associated logic component in programmable logic 18.

As an example, the programmable elements 20 may be random-access memory (RAM) cells that are loaded from an external erasable-programmable read-only memory chip via pins 14 and input/output circuitry 12. The loaded RAM cells 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18.

The circuit elements may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses, programmable logic devices in which elements 20 are formed from electrically-programmable read-only-memory (EPROM) or erasable-electrically-programmable read-only-memory (EEPROM) technology, or programmable logic devices with programmable elements made from magnetic storage elements, etc.

If desired, programmable logic device 10 may be programmed using a mask programming arrangement. In mask programming arrangements, customized photolithographic masks may be used to define the location of vias and other circuit elements for a device. These customizable circuit elements form programmable elements 20 of FIG. 1 and are provided with configuration data as part of a mask fabrication process (i.e., the programming masks are provided with a pattern of via mask structures corresponding to the configuration data). During fabrication, the custom set of vias and other circuit elements form customized electrical paths on device 10 that program device 10 to implement a custom logic function. Programmable logic devices that may be programmed using masks in this way are sometimes referred to as "structured ASICs."

Programmable logic devices 10 may use one or more of these programming technologies to implement programmable elements 20.

Regardless of the particular type of programmable element arrangement that is used for device 10, programmable elements 20 are preferably provided with configuration data by a user (e.g., a logic designer). Once provided with configuration data, the programmable elements 20 selectively interconnect and control circuitry on device 10 and thereby configure the circuitry in programmable logic 18. The configured programmable logic may be used to implement customized circuit functions.

The circuitry on device 10 may be controlled using signals from external sources (e.g., control signals received from other integrated circuits via input/output circuitry 12) or signals from internal circuitry such as programmable elements 20 and programmable logic 18. Control signals associated with programmable elements 20 generally do not change once device 10 has been programmed, so these signals may be referred to as static signals. The signals from programmable logic 18 generally change in real time during the operation of programmable logic device 10, so these signals may be referred to as dynamic signals.

Figure 2:
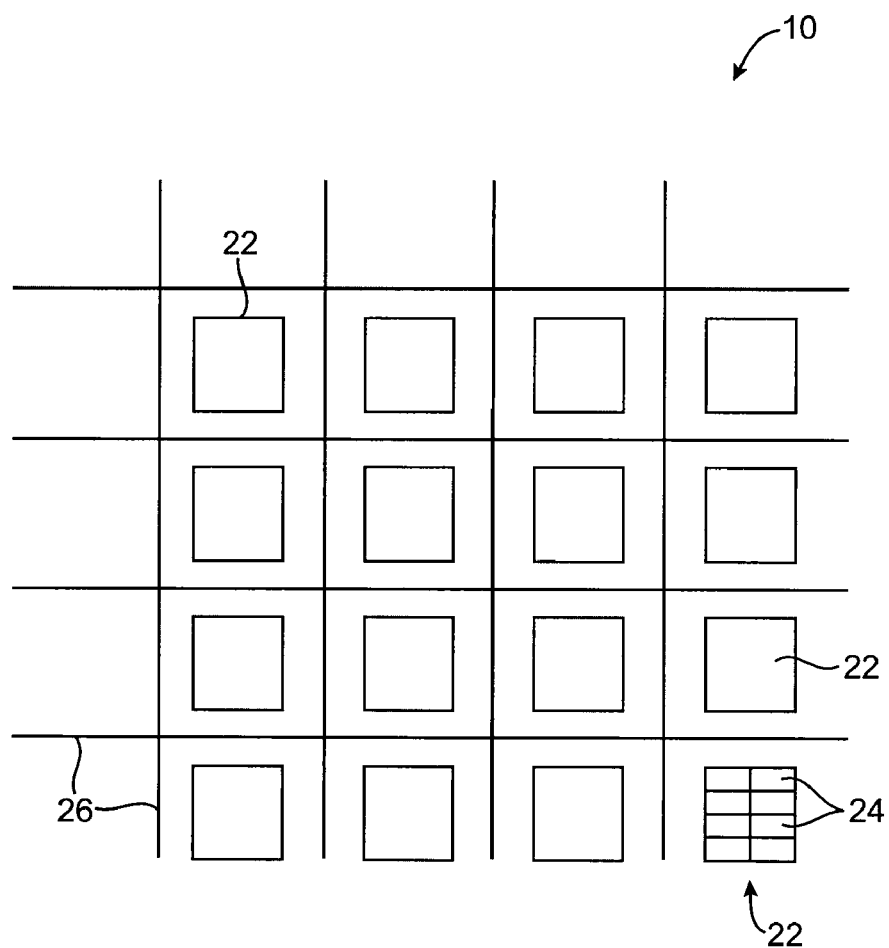
FIG. 2 is a schematic diagram of an illustrative programmable logic device integrated circuit showing how programmable logic may be provided using rows and columns of programmable logic blocks and how blocks of programmable logic may contain smaller logic elements in accordance with an embodiment of the present invention.

The circuitry of device 10 may be organized using any suitable architecture. As an example, the logic of programmable logic device 10 may be organized in a series of rows and columns of larger programmable logic regions or areas 22 each of which contains multiple smaller logic regions or areas 24 as shown in FIG. 2. These logic resources may be interconnected by interconnection resources such as associated vertical and horizontal conductors 26. Conductors 26 may include global conductive lines that span substantially all of device 10, fractional lines such as half-lines or quarter lines that span part of device 10, staggered lines of a particular length (e.g., sufficient to interconnect several logic areas), smaller local lines that interconnect logic regions 24 with other logic regions 24 in a given area 22, or any other suitable interconnection resource arrangement. If desired, the logic of device 10 may be arranged in more levels or layers in which multiple large areas 22 are interconnected to form still larger portions of logic.

Still other device arrangements may use logic that is not arranged in rows and columns. In some logic devices 10, the larger portions of logic such as logic areas 22 may be referred to as "logic array blocks" (LABs) and the smaller portions of logic such as logic regions 24 may be referred to as logic elements (LEs).

Logic elements 24 may contain combinational logic. For example, logic elements 24 may contain look-up table logic and other programmable logic based on programmable elements 20. Logic elements 24 may also include registers and multiplexer circuitry. The registers and multiplexer circuitry in logic elements 24 may be used in forming scan chains.

Figure 3:
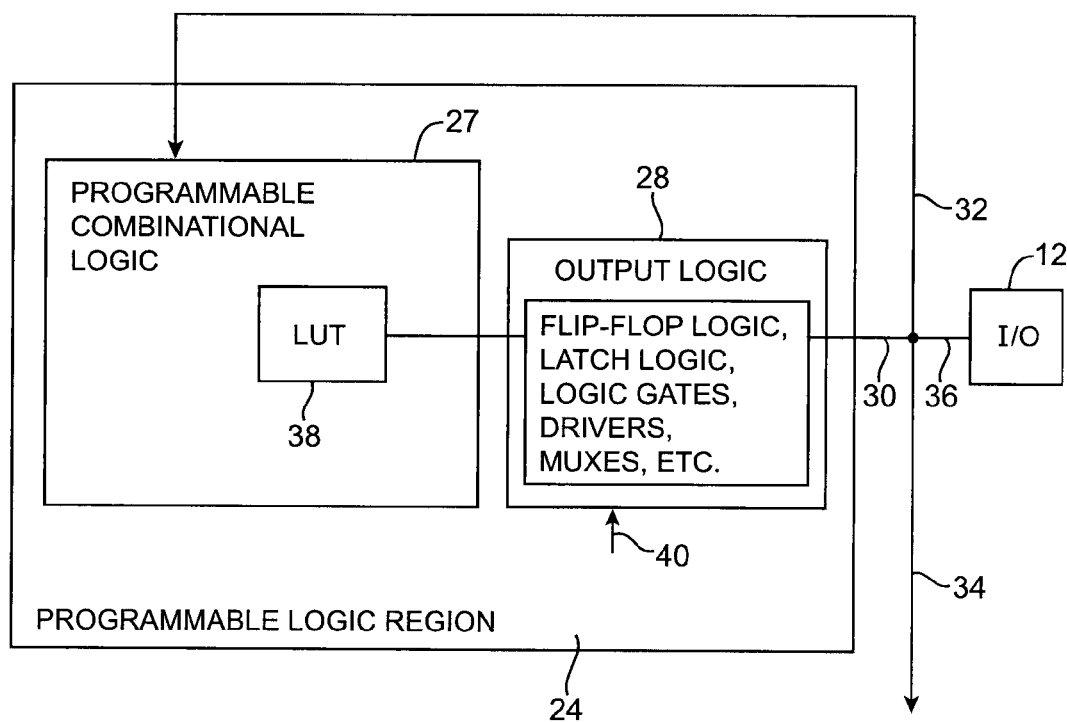
FIG. 3 is a schematic diagram of a region of programmable logic on a programmable logic device in accordance with an embodiment of the present invention.

An illustrative programmable logic device logic region 24 is shown in FIG. 3. Programmable logic region 24 may have programmable combinational logic 27. Logic 27 may generate output signals (output data) that are provided to logic region output line 30 via output logic 28. Combinational logic 27 may use a look-up table such as look-up table 38 or any other suitable combinational logic to produce its output. Output logic 28 may include register logic (e.g., flip flop circuitry, latch circuitry, or other bistable memory element circuitry), logic gates, drivers, multiplexers (muxes), and other suitable logic circuitry. The output logic 28 may be controlled by signals on paths such as path 40.

Logic region output line 30 may provide the output of combinational logic 27 to programmable logic device input/output logic 12 via interconnection resources 16 of FIG. 1 (depicted as line 36 in FIG. 3). If desired, feedback paths may be used to feed back the output signal to one of the combinational logic inputs (see, e.g., path 32). Output logic 28 may also include feedback paths. Paths such as path 34 may be used to route the output signals from a logic region 24 to other logic regions (e.g., using local lines or resources) or to other portions of logic device 10 (e.g., via longer, global resources, etc.).

Figure 4:
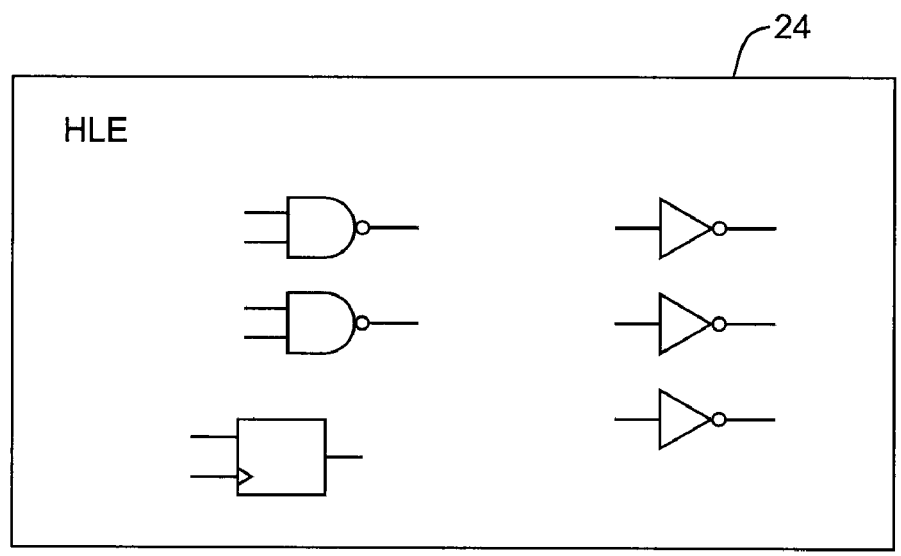
FIG. 4 is a circuit diagram of resources associated with a logic element on a mask-programmed programmable logic device integrated circuit in accordance with an embodiment of the present invention.

On programmable logic devices that are configured using mask programming, logic elements may include circuit resources of the type shown in FIG. 4. These circuit components may be selectively interconnected by using lithographic masks to define a pattern of vias. During device fabrication, the vias form electrical connections between various interconnect lines on the device, thereby programming the device. As shown in the example of FIG. 4, a typical mask-programmed logic element ("HLE") may include circuit components such as inverters, NAND gates, and registers that are interconnected using vias and other electrical connections defined by user-generated custom lithographic masks.

Integrated circuit 10 may contain numerous registers and multiplexers. These registers and multiplexers may be provided as part of logic element circuitry such as logic elements 24 of FIGS. 3 and 4 or other circuitry on integrated circuit 10. When it is desired to form a scan chain, a control signal such as a scan enable control signal may be asserted.

Figure 5:
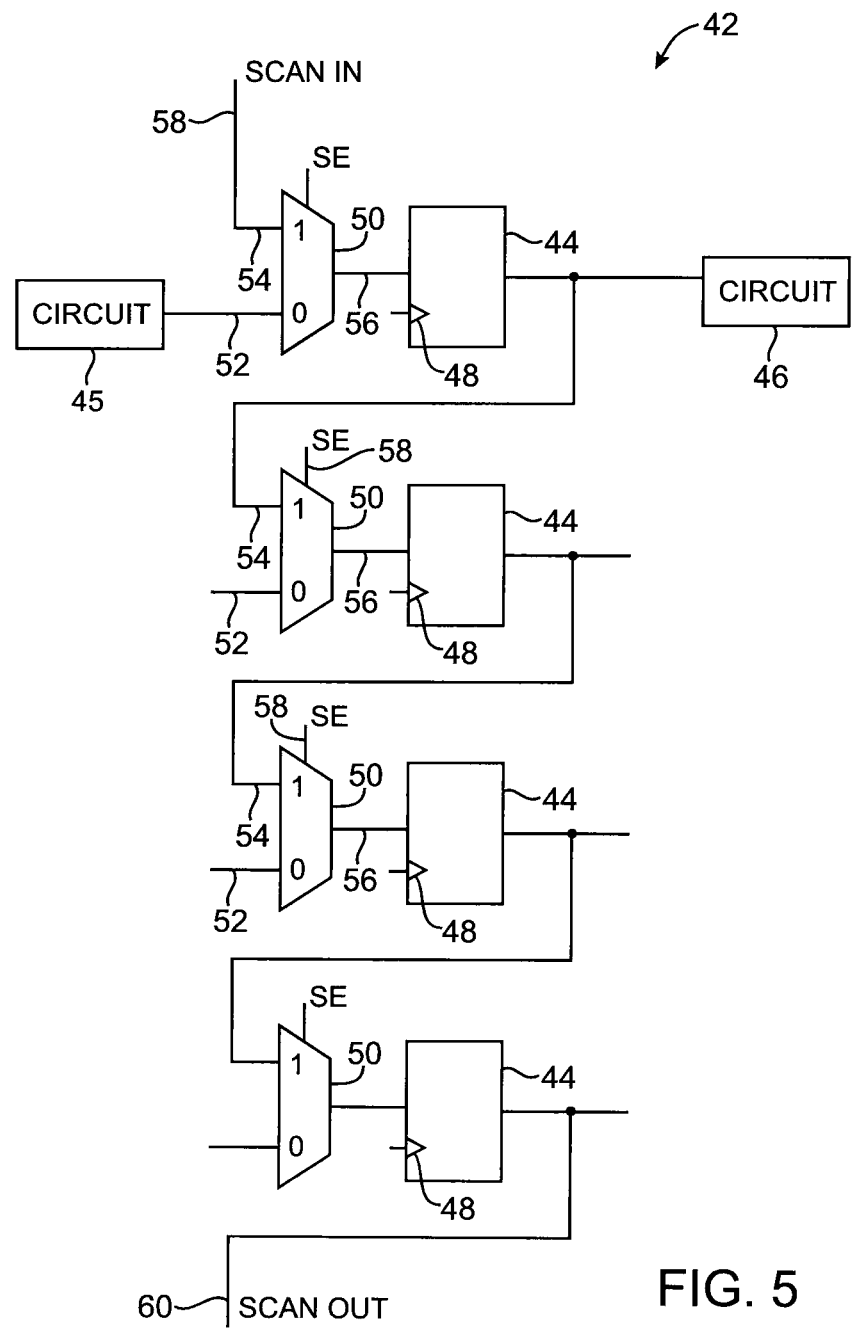
FIG. 5 is schematic diagram of an illustrative scan chain in accordance with an embodiment of the present invention.

Illustrative scan chain circuitry 42 is shown in FIG. 5. The illustrative scan chain 42 of FIG. 5 contains four registers 44. This is merely an example. A scan chain may contain any suitable number of registers (e.g., hundreds or thousands of registers).

During normal operation of the integrated circuit, signals pass through the scan chain registers. In this mode, the registers perform their normal intended function and serve to register the signals passing through them. As an example, a signal may exit circuit 45, pass through the register 44 shown at the top of FIG. 5, and be received at circuit 46. Each register 44 has a clock input 48 that receives a clock signal for controlling the timing of the register. The circuitry that feeds the other registers 44 and that accepts the signals from the other registers 44 is not shown in FIG. 5 to avoid over-complicating the drawing.

The scan chain is formed by providing a scan chain path that connects each register output to the input of the next register in the chain. Each register 44 may have an associated multiplexer 50. Each multiplexer 50 has two inputs (52 and 54) and an output 56. The input 54 of each multiplexer receives scan chain data and is used to form the scan chain. The input 52 of each multiplexer is used during normal operation. For example, the input 52 of the uppermost multiplexer 50 in FIG. 5 is used to convey data from circuit 45 to the uppermost register 44 and circuit 46.

Multiplexers 50 are controlled by respective scan enable (SE) control inputs 58. When the scan enable signal has one state (e.g., a logic low signal), multiplexers 50 are directed to connect their inputs 52 to their outputs 56 so that the integrated circuit can perform its normal operations. When the scan enable signal has another state (e.g., a logic high signal), the scan chain registers are placed in scan mode. In this mode, the multiplexers 50 are directed to connect their scan chain inputs 54 to their respective outputs 56. This isolates the circuitry such as circuits 45 and 46 from the scan chain and allows scan chain data to flow along the scan chain from scan chain input 58 to scan chain output 60.

To perform a test, test data may serially loaded into the scan chain registers via scan in input line 58. Data that has been captured in the scan chain registers from circuits such as circuit 45 as part of a test can be unloaded from the registers through scan out line 60. During loading and unloading operations, each clock cycle results in a progressive movement of data through the scan chain by one bit position. For example, if it is desired to load three bits of test data into a scan chain through scan input 58, three clock cycles are used.

Scan chains such as scan chain 42 of FIG. 5 may be used to facilitate the application of test data to appropriate circuit locations to perform a test and to facilitate the capturing of the resulting logic signals from the circuitry being tested. In the FIG. 5 example, each scan chain cell includes a register 44 and a corresponding multiplexer 50. If desired, additional scan chain cell circuitry may be provided to facilitate scan chain testing operations such as at-speed delay fault tests.

Figure 6:
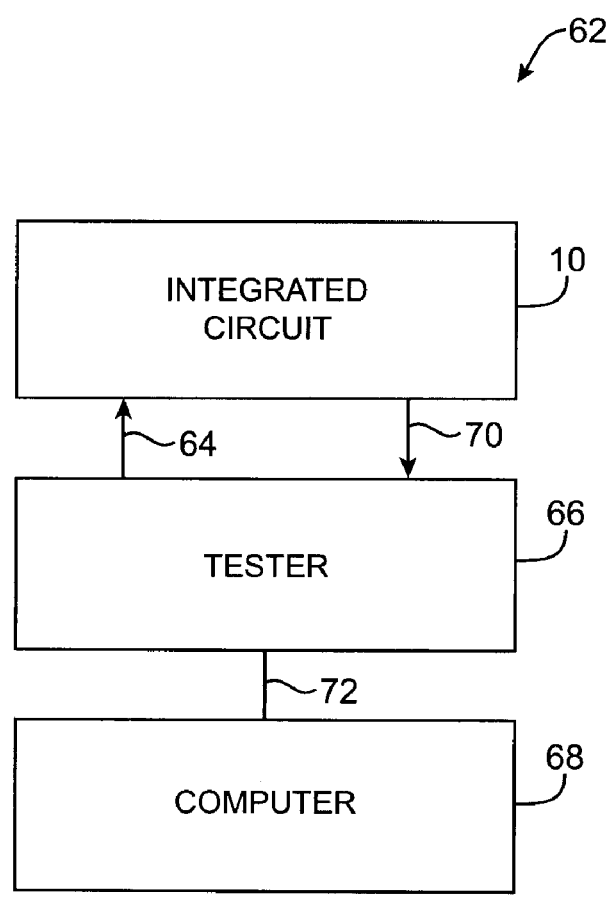
FIG. 6 is a schematic diagram of a test system that may be used in performing scan testing in accordance with an embodiment of the present invention.

An illustrative system 62 that may be used in testing an integrated circuit 10 is shown in FIG. 6. As shown in FIG. 6, signals may be conveyed from tester 66 to integrated circuit under test 10 via path 64 and corresponding signals may be received by tester 66 from integrated circuit under test 10 via path 70. Tester 66 may be a tool such as an automatic test pattern generation (ATPG) tool that applies test data of various patterns to test circuit 10. The test data may include test configuration data (e.g., to configure a programmable integrated circuit to implement test logic) and test vectors. Test configuration data may be loaded into programmable elements 20. Test vectors may be applied to input-output pins 14. Test data may also be loaded into scan chain registers. Test control signals (e.g., scan enable signals and other control signals) may be applied to scan chain circuitry and other circuitry in integrated circuit 10 during testing.

Tester 66 may communicate with external equipment such as computer 68. For example, tester 66 may pass test results to computer 68 that have been captured in a scan chain. The test results may include the results of at speed delay fault tests.

Integrated circuits 10 may be tested before and after packaging. Slightly different testing arrangements are typically used to test circuits 10 that have been packaged than are used to test circuits 10 that are unpackaged.

Figure 7:
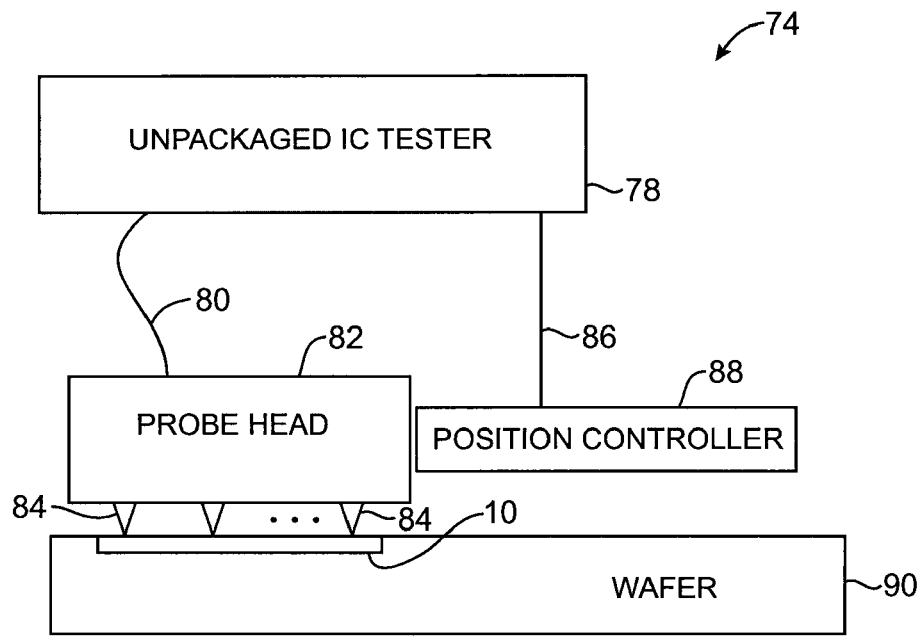
FIG. 7 is a cross-sectional side view of an illustrative test system that may be used in performing scan testing on an unpackaged integrated circuit die in accordance with an embodiment of the present invention.
Figure 8:
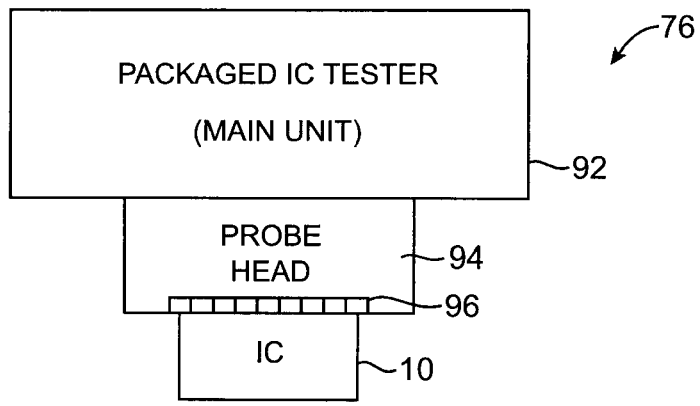
FIG. 8 is a cross-sectional side view of an illustrative test system that may be used in performing scan testing on a packaged integrated circuit die in accordance with an embodiment of the present invention.

Illustrative testing systems that may be used to test packaged and unpackaged integrated circuits 10 are shown in FIGS. 7 and 8. FIG. 7 shows test equipment 74 that may be used to test unpackaged integrated circuits. FIG. 8 shows test equipment 76 that may be used to test packaged integrated circuits.

As shown in FIG. 7, tester equipment 74 may include a tester main unit 78. To support programmable logic device testing, unpackaged integrated circuit tester 78 may include computing equipment that provides test configuration data and test vectors for testing programmable integrated circuits. Tester 78 can also gather and analyze output signals from an integrated circuit under test such as integrated circuit 10 to determine whether the circuit is performing properly. Tester 78 may be connected to a probe head 82 via a path such as cable 80. Path 86 may be used to connect tester 78 to position controller 88. Position controller 88 may be used to adjust the location of probe head 82 (e.g., using an x-y-z translation stage or other suitable position controlling equipment). Using position controller 88, tester 78 can position probe head 82 over various different integrated circuits in wafer 90. An illustrative integrated circuit 10 at which position controller 88 has located probe head 82 is shown in FIG. 7.

Probe head 82 may have electrical contacts such as probe tips 84. Tester 78 may be used to issue positioning instructions to position controller 88 that direct position controller 88 to position probe head 82 at a given integrated circuit 10. The positioning instructions also direct position controller 88 to position probe head 82 against integrated circuit 10 so that probe tips 84 make electrical contact with mating conductive pads on integrated circuit 10. After electrical contact has been established between tester 78 and integrated circuit 10, tester 78 of test equipment 74 can load test configuration data into the programmable logic of integrated circuit 10 (if device 10 is a programmable integrated circuit) and may apply test data (e.g., using input-output pins, scan chain circuitry, etc.).

With the illustrative testing equipment of FIG. 7, integrated circuits 10 may be tested before packaging operations are performed. Integrated circuits 10 may, for example, be tested while they are still part of a wafer containing one or more integrated circuits such as wafer 90. After packaging, integrated circuits 10 can be tested using test equipment such as test equipment 76 of FIG. 8.

As shown in FIG. 8, packaged integrated circuit test equipment 76 may include a tester main unit 92. Tester 92 may include computing equipment that provides test data to integrated circuit 10. If integrated circuit 10 is a programmable integrated circuit, tester 92 may also be used to supply test configuration data to integrated circuit 10. As the integrated circuit 10 responds to applied test vectors and other test signals, tester 92 can be used to gather output data from circuit 10 and can analyze this data to determine whether integrated circuit 10 is performing properly. As shown in FIG. 6, a computer such as computer 68 may be used with testers such as tester 78 of FIG. 7 and tester 92 of FIG. 8 to perform test analysis operations, if desired.

As shown in FIG. 8, tester 92 may be electrically connected to probe head 94. Probe head 94 may have probe tips or other suitable conductive structures 96 that mate with the pins of the package of integrated circuit 10. Positioning equipment may be used to position each integrated circuit 10 that is to be tested into electrical contact with tester 92 as shown in FIG. 8.

During testing, both packaged integrated circuit testers and unpackaged integrated circuit testers may, if desired, load test configuration data into integrated circuits 10 through the points of contact between the probe heads and the internal circuitry of circuits 10. These contact points are sometimes referred to as "probe points." In unpackaged integrated circuit testers such as unpackaged integrated circuit test equipment 74 of FIG. 7, the probe points are contact pads on circuit 10, because the probe head 82 makes electrical contact directly with these contact pads on the integrated circuit package. In packaged integrated circuit testers such as packaged integrated circuit test equipment 76 of FIG. 8, the probe points are the pins on the package (regardless of shape), because the probe head 94 makes electrical contact with the pins of the package of the integrated circuit.

Figure 9:
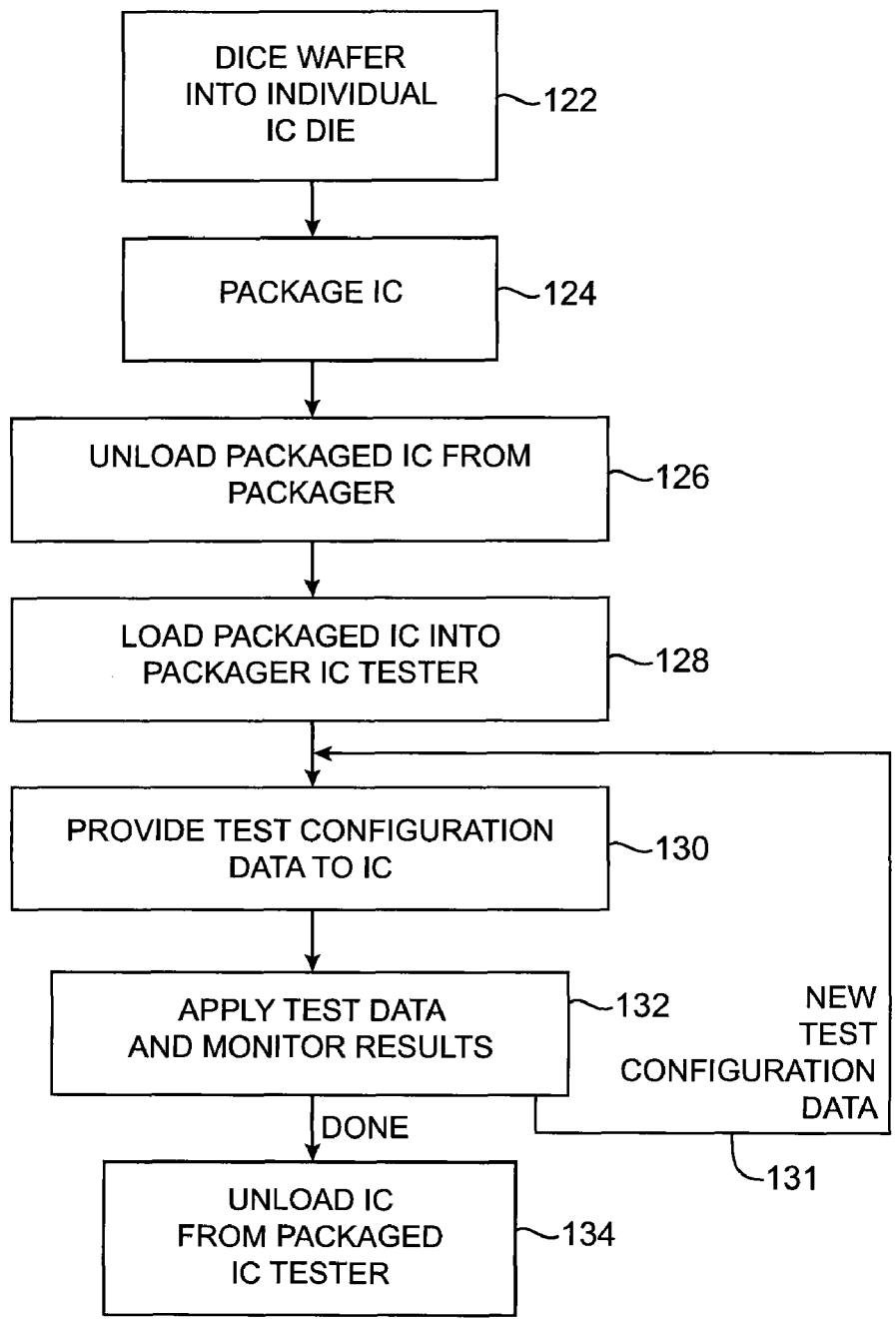
FIG. 9 is a flow chart of illustrative steps involved in performing scan tests on packaged integrated circuits in accordance with an embodiment of the present invention.

Illustrative steps involved in testing packaged integrated circuits 10 are shown in FIG. 9.

At step 122, a wafer containing integrated circuits 10 to be tested is separated into individual unpackaged integrated circuits. The circuits 10 may be separated by sawing the wafer, by cleaving the wafer, etc.

At step 124, the integrated circuits 10 may be packaged into individual packages using packaging equipment. During packaging, the pins of the packages are connected to respective circuitry in integrated circuits 10.

At step 126, after the integrated circuits 10 have been packaged, the packaged integrated circuits 10 are unloaded from the packaging equipment.

At step 128, a packaged integrated circuit 10 may be loaded into packaged integrated circuit test equipment 76 (FIG. 8). When loaded into test equipment 76, the probe points on integrated circuit 10 may make electrical contact with mating portions of probe head 94. Tester 92 may apply power to integrated circuit 10 (e.g., by applying sources of positive voltage Vcc and ground potential Vss to the integrated circuit through head 94 or other electrical paths).

If integrated circuit 10 is a programmable integrated circuit, tester 92 of test equipment 76 may use probe head 94 to provide test configuration data to the integrated circuit 10 at step 130. The test configuration data may be loaded into memory elements 20 using input-output pins 14 and input-output circuitry 12 (FIG. 1). These loading operations may be used to program the programmable logic on integrated circuit 10 to form desired test circuits (user logic blocks) and thereby prepare circuit 10 for the application of test data.

At step 132, the tester 92 may apply test data to integrated circuit 10. Test data may be applied in the form of a series of test vectors that are supplied to input-output pins 14. Test data may also be loaded using scan chain circuitry. Test control signals (e.g., scan enable and test enable signals, etc.) may also be applied during the testing operations of step 132. Test results may be captured using scan chain circuitry and by monitoring the signals that appear on input-output pins 14.

As shown by line 131, test equipment 76 may obtain new test configuration data and the process of steps 130 and 132 may be repeated (e.g., hundreds or thousands of times), if desired. Steps 130 and 132 may be repeated until all sets of desired test configuration data have been applied and the results associated with each different set of test configuration data and associated test vectors have been gathered and analyzed.

At step 134, when testing is complete, the packaged integrated circuit may be unloaded from the packaged integrated circuit tester. If the integrated circuit performs properly during testing, it may be sold to a customer. If an error is detected, the integrated circuit may be repaired or other suitable actions may be taken.

Figure 10:
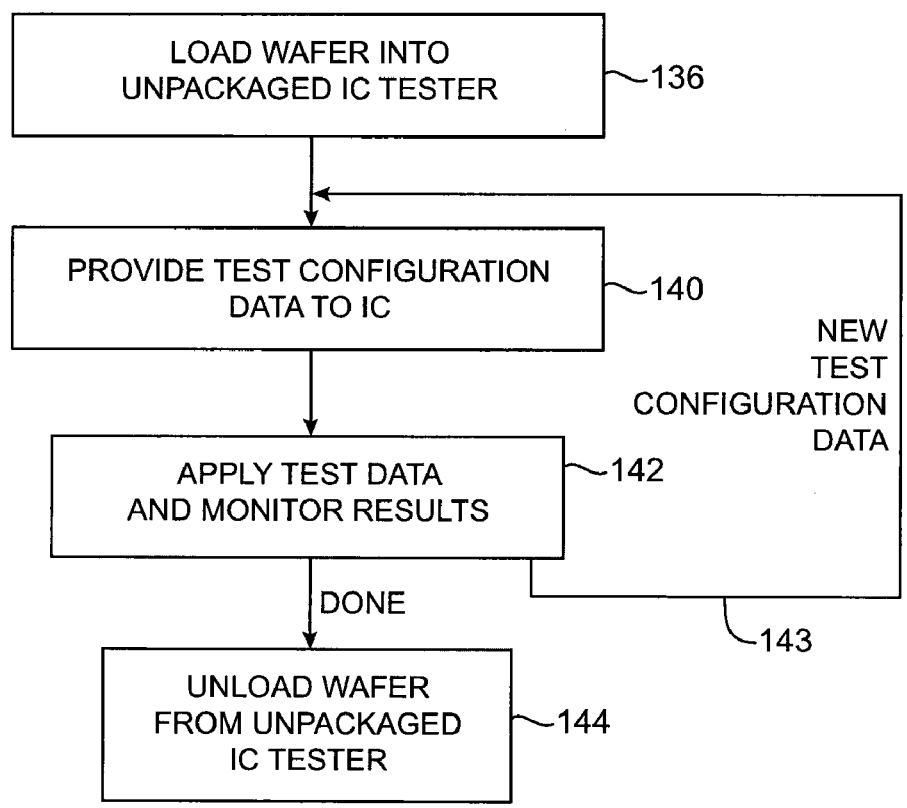
FIG. 10 is a flow chart of illustrative steps involved in performing scan tests on unpackaged integrated circuits in accordance with an embodiment of the present invention.

Illustrative steps involved in testing an unpackaged integrated circuit 10 are shown in FIG. 10.

At step 136, a wafer containing the integrated circuit 10 is loaded into unpackaged integrated circuit test equipment 74 (FIG. 7). An unpackaged integrated circuit 10 may be in wafer form (i.e., as shown by wafer 90 in FIG. 7) or may be in the form of a part of a wafer or an individual die. In the example of FIG. 10, the unpackaged integrated circuit 10 is part of a wafer.

If the integrated circuit under test is a programmable integrated circuit, test configuration data may be loaded into the integrated circuit using tester 78 at step 140. The test configuration data programs the programmable logic in the circuit 10 to form test circuitry (user logic blocks).

At step 142, test data may be applied to the programmed integrated circuit 10 using tester 78 in test equipment 74. As with test equipment 76 of FIG. 8, test data may be applied by test equipment 74 of FIG. 7 in the form of a series of test vectors that are supplied to input-output pins 14. Test data may also be loaded from test equipment 74 into scan chain circuitry in integrated circuit 10. Test control signals (e.g., test enable signals, etc.) may also be applied to circuit 10 during the testing operations of step 142. Test results may be captured using scan chain circuitry on circuit 10 and by monitoring the signals that appear on input-output pins 14.

If desired, the tester may obtain additional test configuration data and the process of steps 140 and 142 may be repeated (e.g., hundreds or thousands of times) until all sets of desired test configuration data have been applied and the results associated with each different set of test configuration data and associated test vectors have been gathered and analyzed, if desired.

When testing is complete, the wafer that contains integrated circuit 10 may be unloaded from the test equipment 74 (step 144).

Figure 11:
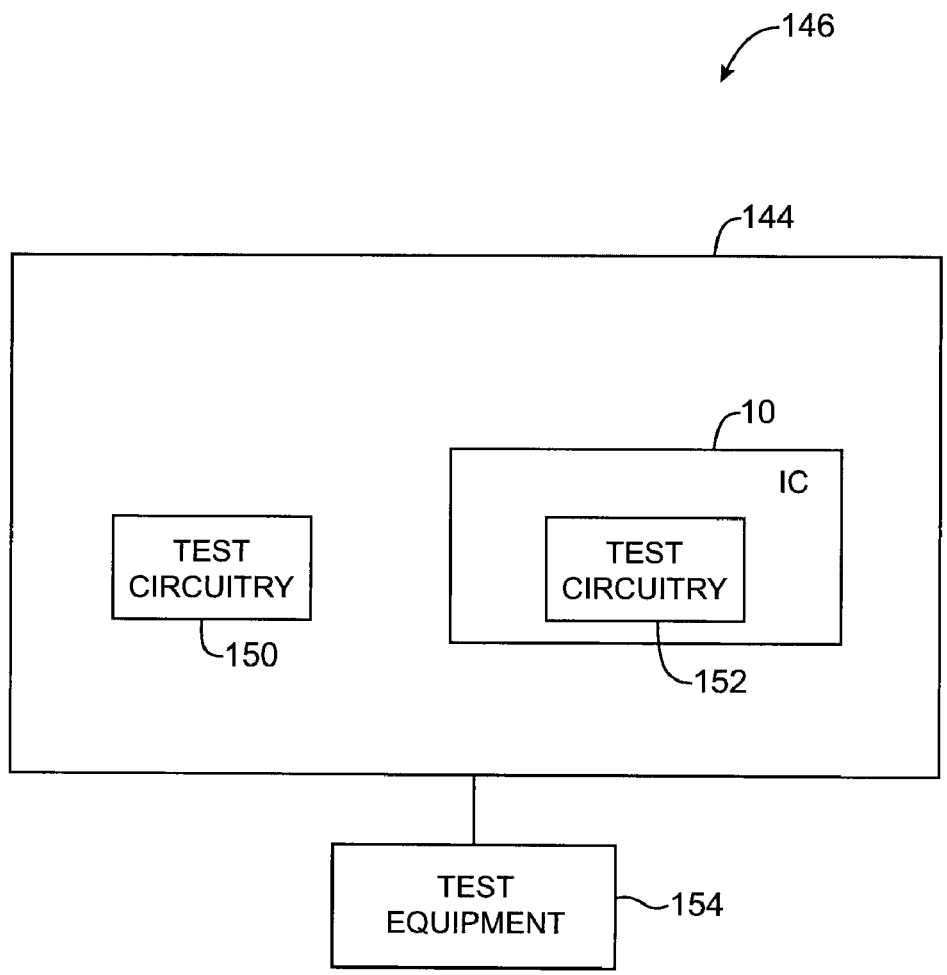
FIG. 11 is a diagram showing how on-chip and on-board circuitry may be used in a test system for performing scan chain tests on an integrated circuit in accordance with an embodiment of the present invention.

If desired, test techniques such as these may be used to test an integrated circuit that has been incorporated into a system. As shown in FIG. 11, for example, an integrated circuit 10 that is to be tested may be mounted on a printed circuit board 148 that forms part of a system 146. Test equipment 154 may test integrated circuit 10 using techniques such as those used by test equipment 74 of FIG. 7 and test equipment 76 of FIG. 8. Integrated circuit 10 may also include optional on-chip test circuitry 152 (sometimes referred to as built-in self-test circuitry) to support test operations. If desired, test support circuits such as test circuit 150 may be mounted on printed circuit board 148. During testing, circuits such as circuits 150 and 152 may be used to help support test operations for test equipment 154. For example, scan chain circuitry in integrated circuit 10 may be loaded, controlled, and unloaded using one or more of test circuit 150, circuit 152, and test equipment 154.

By using scan chain testing, the test equipment of FIGS. 6, 7, 8, and 11 can obtain greater test coverage than would otherwise be possible. Scan chain circuitry in integrated circuit 10 can be used for loading test data and for capturing test results.

To fully test integrated circuit 10, the scan chain circuitry on integrated circuit 10 may be provided with the ability to perform at-speed transition delay fault tests.

Figure 12:
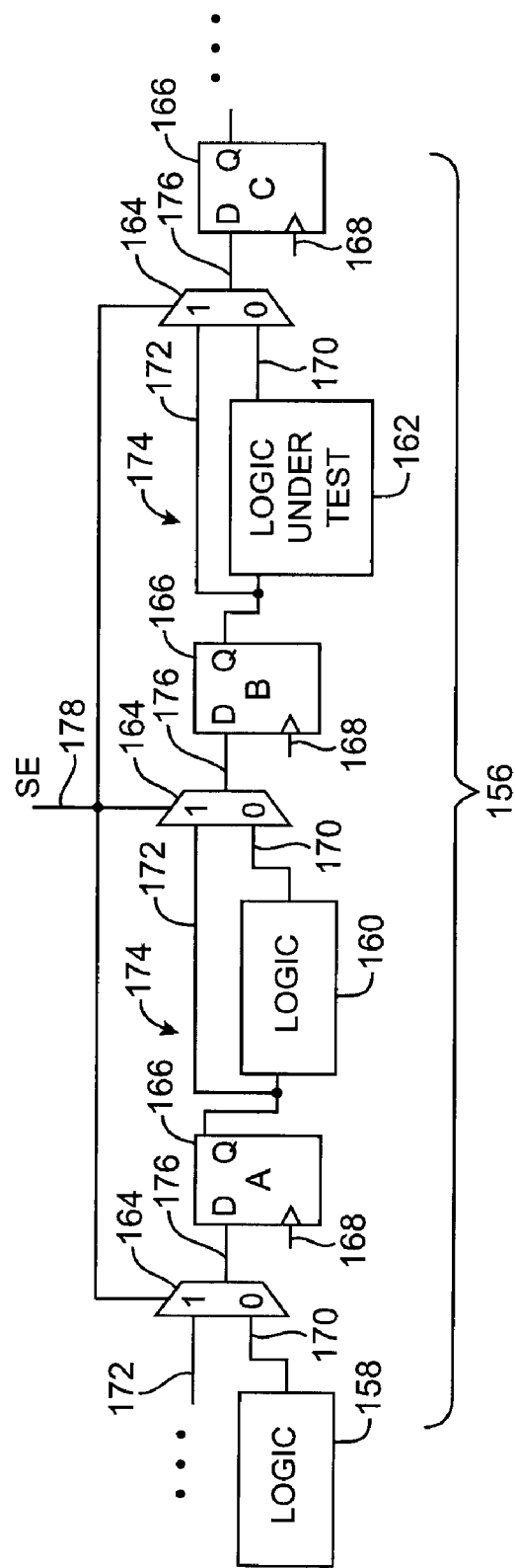
FIG. 12 is a circuit diagram of a conventional scan chain circuit being used to perform delay fault testing on a logic circuit under test.

A portion of a conventional scan chain that may be used to perform conventional delay fault tests is shown in FIG. 12. Scan chain 156 may include numerous registers 166. Three registers 166 are shown in FIG. 12. These three registers 166 are labeled "A," "B," and "C." Circuitry 156 may be selectively configured in response to a received scan enable signal SE received at input 178. When SE is high, each multiplexer 164 connects its "1" input 172 to its corresponding output 176 to form a scan chain. When SE is low, each multiplexer 164 connects its "0" input 170 to its output 176 to connect a corresponding logic circuit such as circuits 158, 160, and 162 to respective outputs 176. Logic circuit 162 in the FIG. 12 example is being delay fault tested. Logic circuits 158, 160, and 162 may contain user logic. Bypass paths 174 may be used to allow inputs 172 of multiplexers 164 to bypass these logic circuits when the scan chain is formed.

Each register 166 has a data input D and a corresponding data output Q. When the clock signal on clock inputs 168 is taken high, the data on inputs D is passed through registers 166 to corresponding data outputs Q.

Figure 13:
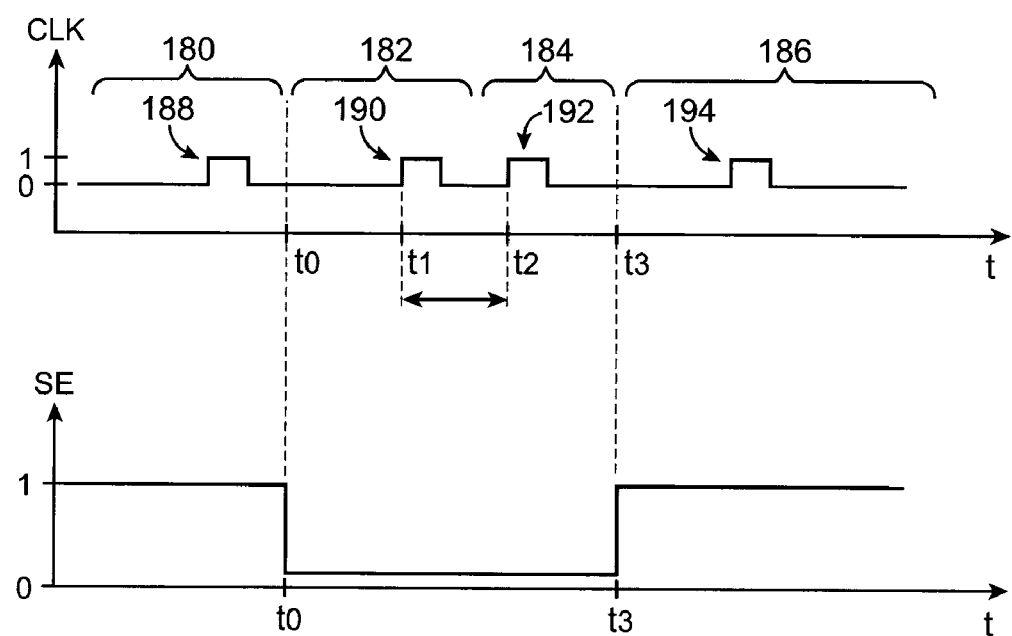
FIG. 13 is a graph of a clock signal and scan enable signal that may be used in implementing a conventional launch-off-capture test scheme as part of a scan test.

The scan chain of FIG. 12 may be used to perform delay fault testing by implementing a conventional launch-off-capture scheme. Signal traces involved in implementing a conventional launch-off-capture scheme are shown in FIG. 13. The graph of FIG. 13 contains two traces. The upper trace of FIG. 13 corresponds to a clock signal CLK that is applied to clock inputs 168 of scan chain 156 (FIG. 12). The lower trace of FIG. 13 corresponds to a scan enable signal SE that is applied to scan enable input 178 of FIG. 12.

There are four time periods in the graph of FIG. 13. During time period 180, scan enable signal SE may be held high to form a scan chain. While SE is high, clock pulses such as clock pulse 188 may be applied to registers 166 to clock data into registers 166.

During time periods 182 and 184, scan enable signal SE is held low, an at-speed signal transition is generated to test logic circuit 162, and test results are captured.

Consider, as an example, the situation in which it is desired to create a low to high ("0" to "1") signal transition at the input to logic under test 162 in FIG. 12. This signal transition may be created at the Q output of register B. Register C can be used to capture the resulting response of logic under test 162.

To create the low to high transition, the initial low state at the output of register B may be created by shifting a "0" into register B through the scan chain during time period 180. An appropriate value for register A that will cause register B to produce a low to high transition should be loaded into register A. The value that should be loaded into A (i.e., a "1" or a "0") is determined by the nature of user logic 160. User logic 160 may include hardwired or programmed logic circuitry. If user logic 160 contains an inverter (as an example), a "0" should be shifted into register A while the "0" is being shifted into register B.

After registers A and B have been loaded with "0" values (in this example), the output of register A will be low and the output of register B will be low. The low output value of register B will be applied to logic under test 162.

At time t0, scan enable signal SE is taken low to take scan chain circuitry 156 out of scan mode. In this configuration, the output of register A is routed to logic 160 and the output of logic 160 is applied to the input of register B. The output of register B is applied to logic under test 162 and the output of logic under test 162 is applied to the input of register C.

Because logic 160 contains an inverter (in this example), the low output of register A is inverted by logic 160. As a result, the D input of register B is high. At time t1 in time period 182, clock pulse 190 is taken high. This causes the output of register B to transition from its initial low value to a logic high value (i.e., because the input to register B from the output of logic 160 is high). Because the signal transition at the output of register B is formed during time period 182, time period 182 is sometimes referred to as the launch cycle of the launch-off-capture process.

Time period 184 is sometimes referred to as the capture cycle. At time t2, after a time of t2–t1 has elapsed, clock signal CLK is again taken high. When the leading edge of pulse 192 goes high at time t2, the output of logic under test 162 on path 170 is captured into register C (i.e., the Q value of register C will be equal to the output of logic under test 162 at time t2). The test equipment that creates pulses t1 and t2 can select the time period t2–t1 so that this time period corresponds to a desired at-speed clock frequency. For example, if at-speed testing at 400 MHz is desired, the test equipment that generates pulses 190 and 192 can generate these pulses so that the time period t2–t1 between the leading edges of pulses 190 and 192 corresponds to a clock frequency of 400 MHz. This ensures that logic under test 162 is tested at a desired clock speed (i.e., at 400 MHz).

At time t3, scan enable signal SE may be taken high to form the scan chain. During time period 186, clock pulses such as pulse 194 may be applied to registers 166 to scan out the captured test results for analysis. The results that are scanned out will include the data that was captured into register C at time t2.

This type of conventional scheme may often be satisfactory, but relies on the presence of appropriate user logic 160 to produce the signal on line 170 that is passed by path 176 to the D input of register B to create the desired signal transition at the output of register B. In many integrated circuits, it may be difficult or impossible to form appropriate user logic 160 that will set up appropriate input values for register B to use in creating desired signal transitions. In these situations, test coverage will be incomplete and at least some circuitry on the integrated circuit under test will not be tested.

Test coverage can be improved using a conventional launch-off-shift process to perform delay fault testing. Scan chain circuitry of the type shown in FIG. 12 may be used when implementing a conventional launch-off-shift delay fault test.

Figure 14:
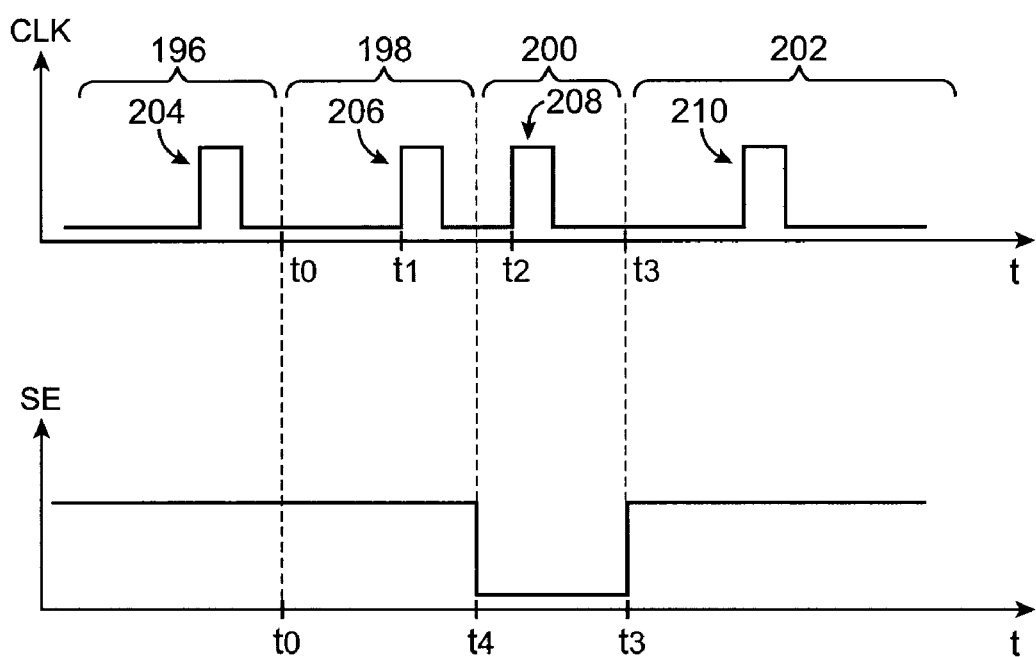
FIG. 14 is a graph of a clock signal and scan enable signal that may be used in implementing a conventional launch-off-shift test scheme as part of a scan test.

Signal traces involved in implementing a conventional launch-off-shift scheme are shown in FIG. 14. As with the graph of FIG. 13, the graph of FIG. 14 contains two traces. The upper trace of FIG. 14 corresponds to a clock signal CLK that is applied to clock inputs 168 of scan chain 156 (FIG. 12). The lower trace of FIG. 14 corresponds to a scan enable signal SE that is applied to scan enable input 178 of FIG. 12.

During time period 196 of FIG. 14, scan enable signal SE may be held high to form a scan chain. While SE is high, clock pulses such as clock pulse 204 may be applied to registers 166 to shift data into registers 166.

During time period 198 (the "launch cycle") and time period 200 (the "capture cycle"), clock pulses 206 and 208 are generated. Scan enable signal SE is taken low at a time t4 between the times t1 and t2 that are associated with the leading edges of clock pulses 206 and 208. By controlling the timing of the high-to-low scan enable signal transition relative to clock pulses 206 and 208, an at-speed delay fault test can be performed and associated test data may be captured into register C.

As an example, consider situation in which it is desired to create a low to high ("0" to "1") signal transition at the input to logic under test 162 in FIG. 12. This signal transition may be created at the Q output of register B. Register C can be used to capture the resulting response of logic under test 162.

To create the low to high transition, the initial low state at the output of register B may be created by shifting a "0" into register B through the scan chain during time period 196, while scan enable SE is high. Unlike the launch-off-capture scheme of FIG. 13, it is not necessary for the configuration of user logic 160 to be involved in creating the low-to-high transition of register B's output. Rather, an appropriate value for establishing the low-to-high transition such as a logic high (i.e., a "1") may be loaded directly into register A during time period 196.

After register B has been loaded with its desire initial value (i.e., a "0" in this example) and after register A has been loaded with the desired new value for register B (i.e., a "1" in this example), the output of register B will be low and the output of register A will be high. The low output value of register B will be applied to logic under test 162.

At time t1, with scan enable signal SE held high, pulse 206 is applied to registers 206. This shifts the "1" value from register A into register B and causes the output of register B to transition from "0" to "1." The output of register B is applied to logic under test 162 and the output of logic under test 162 is applied to the input of register C.

At time t4, after time t1 and before time t2, the test equipment takes scan enable signal SE low. This configures multiplexers 164 to break the scan chain. In particular, the "1" input of the multiplexer 164 that is associated with register C is disconnected from its output 176 and the "0" input of the register C multiplexer 164 is connected to the D input of register C. In this configuration, the output of logic under test 162 is routed to the input of register C.

At time t2 after a time of t2–t1 since the leading edge of pulse 206 and the associated signal transition at the output of register B has elapsed, clock signal CLK is again taken high (pulse 208). When the leading edge of pulse 208 goes high at time t2, the output of logic under test 162 on path 170 is captured into register C. The Q value of register C will therefore be equal to the output of logic under test 162 at time t2. The test equipment that creates pulses t1 and t2 can select the time period t2-t1 so that this time period corresponds to a desired at-speed clock frequency (e.g., to create a simulated clock speed of 400 MHz, etc.).

At time t3, scan enable signal SE may be taken high to form the scan chain. During time period 202, clock pulses such as pulse 210 may be applied to registers 166 to scan out the captured test results for analysis. The results that are scanned out will include the data that was captured into register C at time t2.

This type of conventional launch-off-shift scheme simplifies the signal transition generation process and unlike conventional launch-off-capture schemes such as the launch-off-capture scheme of FIG. 13, is not design dependent. This type of conventional launch-off-shift scheme may therefore offer improved test coverage relative to the conventional launch-off-capture scheme of FIG. 13. However, the launch-off-shift scheme requires precise control of the leading edge of the scan enable signal SE (time t4) relative to times t1 and t2 (i.e., signal SE must be switched at speed). Precise timing control such as this may be complex and costly to implement.

Figure 15:
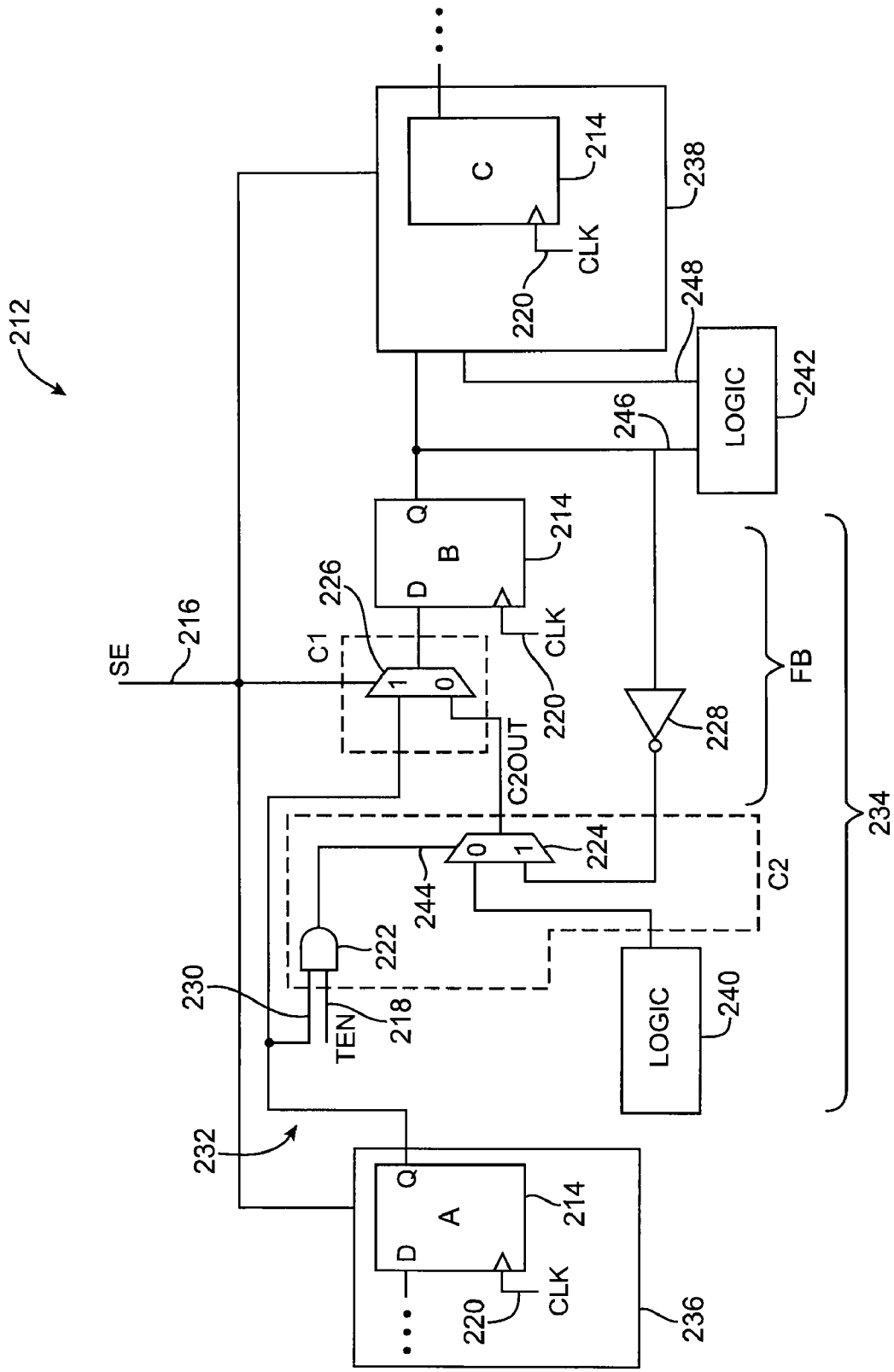
FIG. 15 is a circuit diagram showing an illustrative scan cell that may be used in forming scan chain circuitry for performing at-speed delay fault testing in accordance with an embodiment of the present invention.

Scan circuitry 212 that may be used to perform at-speed delay fault tests in integrated circuit 10 in accordance with an embodiment of the present invention is shown in FIG. 15. Scan chain circuitry 212 may include numerous substantially identical scan cells such as scan cells 236, 234, and 238. These scan cells may include numerous registers 214 and may be formed into a scan chain configuration. Three registers 214 are shown in FIG. 15. These three registers 214 (and their associated scan cells 236, 234, and 238) are respectively labeled "A," "B," and "C" in FIG. 15.

Circuitry 212 may be selectively configured in response to test control signals. For example, circuitry 212 may be controlled using a scan enable signal SE received at input 216 and a test enable signal TEN received at input 218. Each scan cell may include a multiplexer that is controlled by the scan enable signal SE such as multiplexer 226 of scan cell 234. When SE is high, each multiplexer 226 connects its "1" input to its corresponding output. This connects the registers 214 to form a scan chain using paths such as path 232. When SE is low, each multiplexer 226 connects its "0" input to its output.

Multiplexers such as multiplexer 226 may be used to form a first logic circuit C1 in each scan cell. Each scan cell may also contain a second logic circuit C2. In the example of FIG. 15, logic circuit C1 includes a multiplexer 226 that is controlled by scan enable signal SE and logic circuit C2 includes a logic gate 222 (i.e., an AND gate) and a multiplexer 224 that is controlled by a control signal received from the logic gate 222. This is merely illustrative. Logic circuits such as logic circuits C1 and C2 may be formed using other logic circuitry if desired.

As shown in FIG. 15, logic gate 222 may have a first input 218 at which logic gate 222 receives test enable signal TEN. Logic gate 222 may have a second input 230 that is connected to path 232 and receives an output data signal Q from preceding scan chain register A. Multiplexer 224 may have a "0" input connected to the output of user logic 240. Logic 242 (e.g., logic under test) may be similarly connected to this type of multiplexer in the logic circuit C2 in scan cell 238. Logic such as logic 240 and 242 may be any suitable hardwired or programmable logic circuitry (user logic blocks).

When the TEN signal on input 218 is asserted (i.e., taken high), signals on path 230 pass to the output of gate 222 and to the control input 244 of multiplexer 224. When the TEN signal is deasserted (i.e., taken low), the control signal on control input 244 is disabled and held low. When the control signal for multiplexer 224 is low, logic 240 is switched into place and generates the output signal C2OUT from logic circuit C2. This logic circuit output can be routed to the data input D of register B when scan enable signal SE is deasserted (i.e., held low).

A feedback path FB may be formed from the output of register B back to its input. This allows a register output signal in the form of the previous state of register B to be used in generating transitions on output Q of register B, rather than relying on user logic (e.g., logic 160 in the conventional launch-off-capture example of FIG. 13).

Feedback path FB may include logic such as inverter logic 228 and may be connected to the "1" input of multiplexer 224 in logic circuit C2 of scan cell 234.

Each of the scan cells in scan chain circuitry 212 may include the same circuitry as scan cell 234, connected to selectively form a chain.

The scan chain of FIG. 15 may be used to perform delay fault testing when controlled with appropriate test control signals. Illustrative signal traces involved in implementing a delay fault test using the scan chain circuitry of FIG. 15 are shown in FIG. 16.

Figure 16:
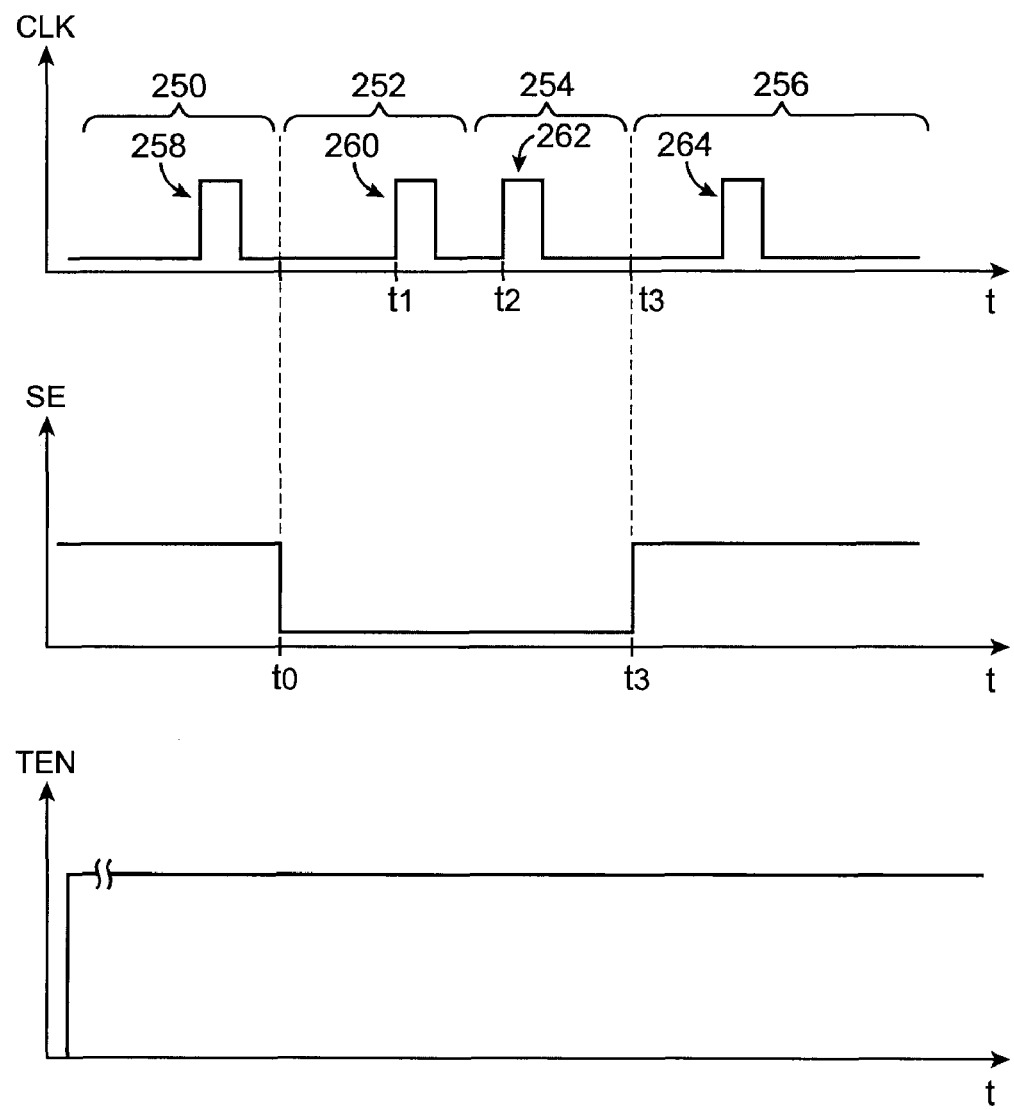
FIG. 16 is a graph of a clock signal, scan enable signal, and test enable signal that may be used in performing at-speed delay fault testing in accordance with an embodiment of the present invention.

The graph of FIG. 16 contains three traces. The upper trace of FIG. 16 corresponds to a clock signal CLK that is applied to clock inputs 220 of scan chain registers 214 (FIG. 15). The middle trace of FIG. 16 corresponds to a scan enable signal SE that is applied to scan enable input 216 of FIG. 15 and is distributed to the multiplexer 226 in the logic circuit C1 of each scan chain cell. The lower trace of FIG. 16 corresponds to test enable signal TEN that is applied to the control input 218 of logic circuit C2 in each scan chain cell.

There are four time periods in the graph of FIG. 16. During time period 250, scan enable signal SE and test enable signal TEN may be held high. With SE high, the signals from bypass paths 232 are routed to the data inputs of registers 214 to form a scan chain. With TEN high, the signals on path 232 are passed to control inputs 244 of multiplexers 224.

Consider, as an example, the situation in which it is desired to create a low to high ("0" to "1") signal transition at the input to logic under test 242 in FIG. 15. This signal transition may be created at the Q output of register B. Register C can be used to capture the resulting response of logic under test 242.

To create the low to high transition, the initial low state at the output of register B may be created by shifting a "0" into register B through the scan chain during time period 250. When inverted by inverter 228 in feedback path 228, the "0" output signal at output Q of register b forms a "1" at the "1" input of multiplexer 224. To route the "1" input from multiplexer 224 to the input of register B, an appropriate data value may be shifted into register A during period 250. In particular, a "1" may be loaded into register A. This will cause the signal on line 232 to be high. The high signal on line 232 will crate a "1" at input 230 of logic gate 222. Because signal TEN is high on input 218 during period 250, the value of the control signal on control input 244 of multiplexer 224 will be "1." With the control signal on input 244 at a "1" value, the "1" at the "1" input of multiplexer 224 will be routed to the "0" input of multiplexer 226 as signal C2OUT.

At time t0, when transitioning between time period 250 and launch cycle time period 252, scan enable signal SE is taken low. This connects the "0" input of multiplexer 226 to the D input of register B. Because the value of C2OUT is "1," the output of register B transitions from "0" to "1" at the leading edge of clock pulse 260 (i.e., at time t1). This transitioning signal is applied to logic under test 242 via path 246. The corresponding test response of logic circuit 242 is routed to the D input of register C via the path 232 and multiplexer 226 in scan cell 238.

Clock pulse 262 is generated at time t2 during capture cycle time period 254. At time t2, a time of t2−t1 has elapsed since the creation of the signal transition on path 246. The leading edge of pulse 262 is received at the clock input 220 of register C and causes the output of logic under test 242 on path 248 to be captured into register C (i.e., the Q value of register C will be equal to the output of logic under test 242 at time t2). The test equipment that creates pulses t1 and t2 can select the time period t2−t1 so that this time period corresponds to a desired at-speed clock frequency. For example, if at-speed testing at 400 MHz is desired, the test equipment that generates pulses 260 and 262 can generate these pulses so that the time period t2−t1 between the leading edges of pulses 260 and 262 corresponds to a clock frequency of 400 MHz. This ensures that logic under test 242 is tested at a desired clock speed (i.e., at 400 MHz).

At time t3, scan enable signal SE may be taken high to form the scan chain. During time period 256, clock pulses such as pulse 264 may be applied to registers 214 to scan out the captured test results for analysis by the test equipment. The results that are scanned out will include the data that was captured into register C at time t2.

This type of scheme provides the ability to perform at-speed delay fault testing without requiring that user logic 240 be configured to provide an appropriate signal value to the input of register B as required in the conventional launch-off-capture scheme of FIG. 13. The strict timing requirements of the conventional launch-off-shift testing scheme of FIG. 14 are also avoided.

Figure 17:
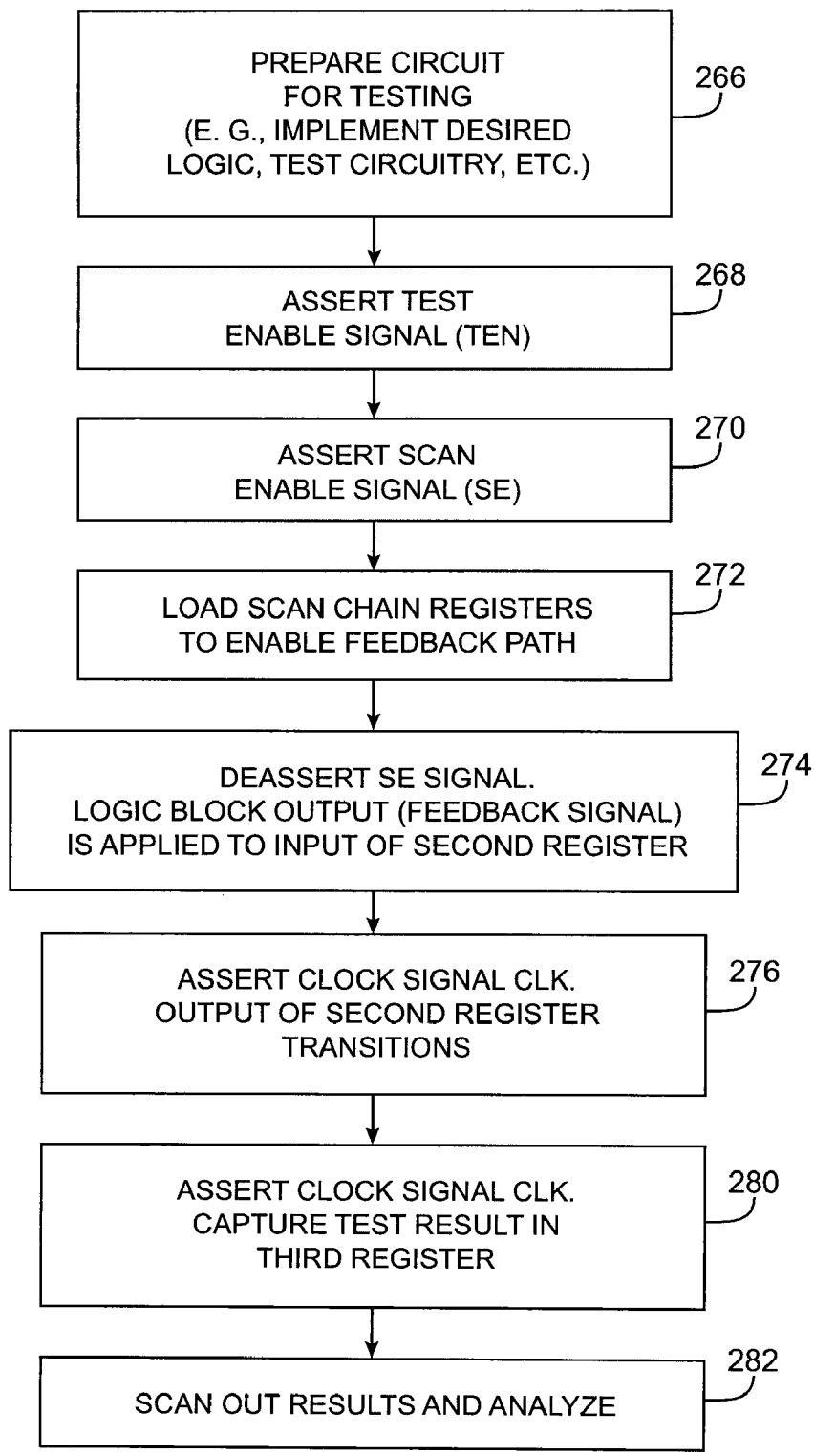
FIG. 17 is a flow chart of illustrative steps involved in performing at-speed delay fault testing of an integrated circuit in accordance with an embodiment of the present invention.

Illustrative steps involved in performing at speed delay fault tests using arrangements of the type described in connection with FIGS. 15 and 16 are shown in FIG. 17.

At step 266, integrated circuit 10 may be prepared for testing. For example, if integrated circuit 10 is a programmable integrated circuit, test configuration data may be loaded into circuit 10 to configure circuit 10 as desired or desired circuitry in circuit 10 may be formed by mask programming.

At step 268, test equipment such as the test equipment of FIG. 6, test equipment 74 of FIG. 7, test equipment 76 of FIG. 8, or test equipment 14 and associated test equipment circuitry 150 and 152 of FIG. 11 may be used to assert a test control signal such as test enable signal TEN of FIG. 15.

At step 270, the test equipment may assert a scan enable signal SE to place scan chain circuitry 212 in scan mode.

After forming a scan chain in circuit 10 at step 270, appropriate signals may be loaded into the registers of the scan chain at step 272. A feedback path such as path FB may be used to feed back signals from the output of a register such as register B towards its input to use in subsequent formation of a desired test signal transition (e.g., a "0" to "1" transition or a "1" to "0" transition).

At step 274, the scan enable signal SE may be deasserted, as described in connection with time t0 of FIG. 16.

At step 276 (time t1 of FIG. 16), the clock signal CLK at the inputs to registers 214 in scan chain circuitry 212 is asserted. This causes the register output signal that was fed back to the input of register B to force the output of register B to change state. The change in state of the output signal for register B corresponds to a signal transition that is applied as a test input to logic under test 242.

At step 280, the resulting output of logic under test 242 may be captured into register C by asserting the clock signal CLK at the clock input 220 of register C.

At step 282, the scan chain may be formed by asserting scan enable signal SE, the clock may be asserted repeatedly to shift out the captured test results into the test equipment, and the test equipment or other suitable computer-based equipment may be used to analyze the test results to determine if a delay fault is present in the circuit under test.

Figure 18:
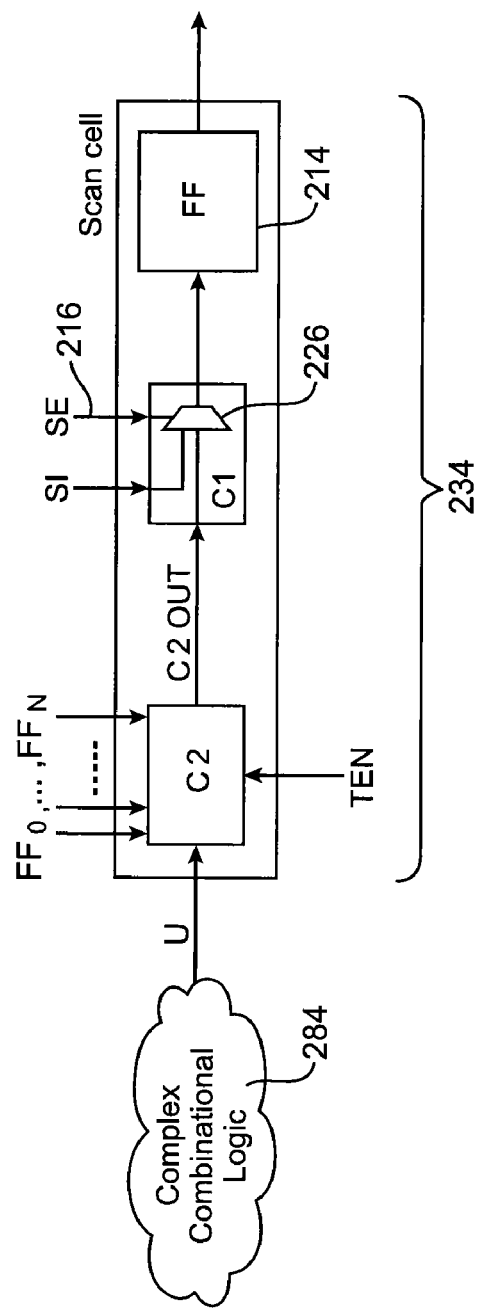
FIG. 18 is a diagram of a generalized scan cell that may be used in at-speed delay fault testing of an integrated circuit in accordance with an embodiment of the present invention.

If desired, other logic circuit arrangements may be used for the scan cells of scan chain circuitry 212. FIG. 18 shows a generalized version of scan chain cell 234. As shown in FIG. 18, scan cell 234 may include a register 214. Logic circuit C1 may be formed from a multiplexer 226 and may be controlled by a scan enable signal SE on input 216. A scan chain input SI may feed one input of logic circuit C1. Scan chain input SI may be received from the output of a register in a preceding scan cell 234 in a scan chain circuit. Logic circuit C2 may receive register output signals FF0-FFN as inputs (i.e., the feedback signal from the output of register B on feedback path FB in the FIG. 15 example or the output from one or more of the registers in preceding scan cells in the scan chain circuitry). Logic circuit C2 may also receive a test control signal such as test enable signal TEN and the output U of user logic 284 (e.g., logic 240 or logic 242 of FIG. 15). The register signals received by logic circuit C2 may be routed to the input of register 214 in response to signal TEN and signal SE.

Figure 19:
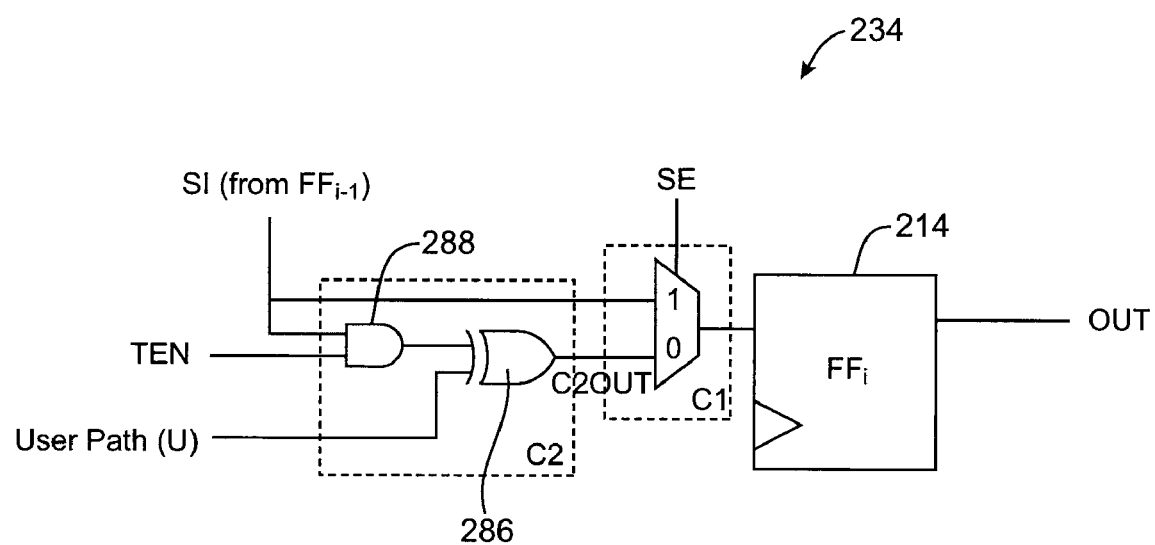
FIGS. 19 and 20 are circuit diagrams of illustrative scan test circuitry for at-speed delay fault testing of integrated circuits in accordance with embodiments of the present invention.

FIG. 19 shows how scan chain cell 234 may have a logic circuit C2 that includes an exclusive OR gate 286 and an AND gate 288. With this type of configuration, signal OUT will be equal to scan in signal SI when scan enable signal SE is asserted, regardless of the state of signal TEN ("scan shift mode"). When signal SE and TEN are both deasserted, user path U is connected to register 214 and cell 234 can be operated in "launch-off-capture" mode. A shift dependent mode of operation may be obtained by taking SE low while holding TEN high. The test enable signal TEN in the FIG. 19 circuit is used to disable the effect of the scan shift (SI) in user mode.

Figure 20:
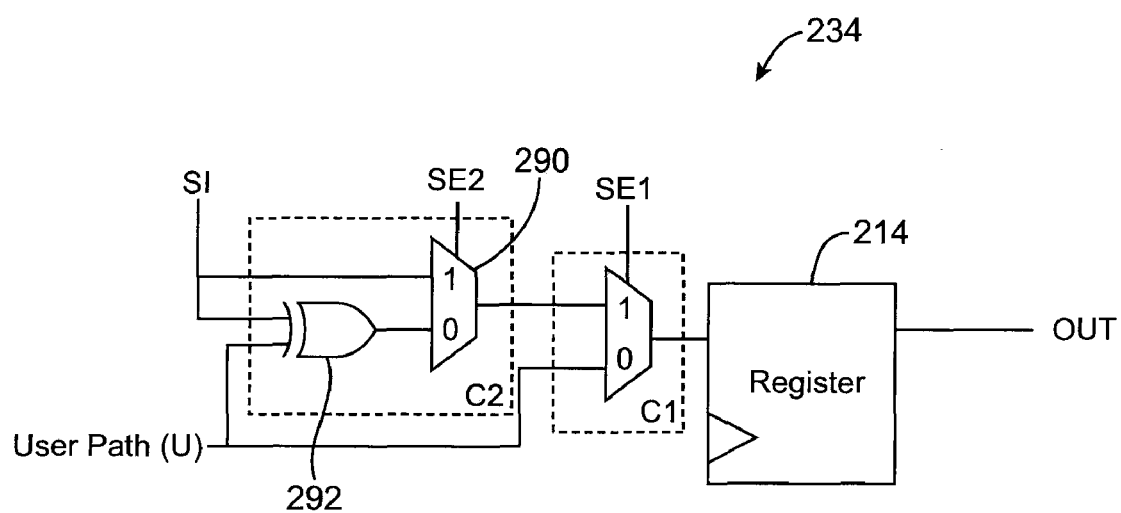

Another illustrative arrangement for scan cell 234 is shown in FIG. 20. In the FIG. 20 configuration, scan cell circuit 234 has a logic circuit C2 formed from an exclusive OR gate 292 and a multiplexer 290. With this arrangement, scan enable operations may be controlled by two mutually exclusive global scan enable signals SE1 and SE2. Whichever of the two scan enable signals (SE1 or SE2) is not being used is constrained to a logic "1" value. A launch-off-capture mode may be enabled by holding SE2 at "1" while SE1 is used as a scan enable signal (i.e., with SE2 at "1", the scan chain may be placed in scan mode with OUT equal to SI if SE1 is taken to "1" and may be placed in launch-off-capture mode if SE1 is taken to "0"). A shift-dependent mode may be activated by holding SE1 at "1" while SE2 is used as a scan enable signal (i.e., with SE1 at "1", the scan chain may be placed in scan shift mode with OUT equal to SI if SE2 is taken to "1" and may be placed in a shift dependent test mode if SE2 is taken to "0").

The foregoing is merely illustrative of the principles of this invention and various modifications can be made by those skilled in the art without departing from the scope and spirit of the invention.

What is claimed is:

1. Scan chain circuitry comprising a plurality of scan chain cells, each scan chain cell comprising:
   a register having an input and an output;
   a first logic circuit having an input, having an output coupled to the input of the register, and having a scan enable control input operable to receive a scan enable signal to place the plurality of scan chain cells in the scan chain circuitry in scan mode;

a second logic circuit having a first input operable to receive a signal from an associated logic block, a second input operable to receive a register output signal, and a third input operable to receive a test enable signal, wherein the second logic circuit has an output that is coupled to the input of the first logic circuit; and a path operable to convey the register output signal to the second input from a register in a preceding one of the scan chain cells in the scan chain circuitry.

2. The scan chain circuitry defined in claim 1 wherein the associated logic block comprises a block of user-configured logic.

3. The scan chain circuitry defined in claim 1 wherein the associated logic block comprises a block of programmable logic having associated programmable elements loaded with configuration data.

4. The scan chain circuitry defined in claim 1 wherein the associated logic block comprises a block of mask-programmed logic.

5. The scan chain circuitry defined in claim 1 wherein each scan chain cell further comprises an inverter in a path operable to convey the register output signal of the register in that scan chain cell to the second input.

6. The scan chain circuitry defined in claim 1 wherein each scan chain cell further comprises a feedback path coupled to the output of the register and operable to supply the register output signal to the second input.

7. The scan chain circuitry defined in claim 6 wherein each scan chain cell further comprises an inverter in the feedback path operable to convey the register output signal to the second input.

8. The scan chain circuitry defined in claim 7 wherein the associated logic block comprises a block of programmable logic having associated programmable elements loaded with configuration data.

9. The scan chain circuitry defined in claim 7 wherein the associated logic block comprises a block of mask-programmed logic and wherein each scan chain cell is formed from circuit components in a respective mask-programmed logic element.

10. The scan chain circuitry defined in claim 1 wherein the first logic circuit comprises a multiplexer.

11. The scan chain circuitry defined in claim 10 wherein the second logic circuit comprises a multiplexer.

12. The scan chain circuitry defined in claim 10 wherein the second logic circuit comprises a multiplexer and an AND gate having an output coupled to a control input of the multiplexer in the second logic circuit.

13. The scan chain circuitry defined in claim 10 wherein the second logic circuit comprises an exclusive OR gate.

14. A method for using scan chain circuitry to perform at-speed delay fault testing of an integrated circuit comprising:

receiving an asserted test enable signal with the scan chain circuitry;

receiving an asserted scan enable signal with the scan chain circuitry;

while the test enable signal and the scan enable signal are asserted, loading the scan chain circuitry with data signals;

after the scan chain circuitry has been loaded with the data signals, receiving a deasserted scan enable signal;

after the deasserted scan enable signal has been received, receiving a first clock pulse to create a signal transition that is applied to a logic circuit under test on the integrated circuit, wherein the logic circuit under test has an output; and after the first clock pulse has created the signal transition, capturing corresponding test data from the output of the logic circuit under test that is associated with the signal transition by receiving a second clock pulse.

15. The method defined in claim 14 further comprising:
after capturing the corresponding test data, shifting the test data out of the scan chain circuitry.

16. The method defined in claim 14 further comprising:
creating the signal transition by feeding back a register output signal in the scan chain circuitry to a register input using a feedback path in a scan cell, wherein the feedback path is selectively formed at least partly in response to the test enable signal.

* * * * *